United States Patent

Ohkawa

Patent Number: 6,139,681
Date of Patent: Oct. 31, 2000

[54] PLASMA ASSISTED PROCESS VESSEL CLEANER

[75] Inventor: Tihiro Ohkawa, La Jolla, Calif.

[73] Assignee: Archimedes Technology Group, Inc., San Diego, Calif.

[21] Appl. No.: 09/265,189

[22] Filed: Mar. 9, 1999

[51] Int. Cl.[7] ............... H05H 1/00; C27C 16/00
[52] U.S. Cl. ............ 156/345; 118/715; 134/1.1
[58] Field of Search ............ 156/345; 118/723 AN, 118/723 ER, 723 IR, 723 MA; 438/905; 134/1.1, 1.2, 22.1, 22.12, 22.11, 40, 130

[56] References Cited

U.S. PATENT DOCUMENTS

| | | | |
|---|---|---|---|
| 5,556,765 | 9/1996 | Dedolph | 435/41 |
| 5,868,909 | 2/1999 | Eastlund. | |
| 5,888,830 | 3/1999 | Mohan et al. | 436/174 |
| 5,961,773 | 10/1999 | Ichimura et al. | 156/345 |

OTHER PUBLICATIONS

Anders, André, Interaction of Vacuum–Arc–Generated Macroparticles with a Liquid Surface; *American Institute of Physics*; 1998, 3 pages. (3199–3201) (no month).

*Primary Examiner*—Shrive Beck
*Assistant Examiner*—Parviz Hassanzadeh
*Attorney, Agent, or Firm*—Nydegger & Associates

[57] ABSTRACT

A system and method for removing plasma contaminants from a vacuum vessel requires circulating a fluid through the vacuum vessel and thereby exposing the fluid to the contaminants. When the contaminants contact the fluid, they are trapped and become suspended in the fluid. The contaminants are then removed from the vacuum vessel along with the fluid. Subsequently, the contaminants can be removed from the fluid, and the fluid reintroduced into the vessel for the subsequent removal of additional contaminants. For one embodiment, a cleaning plasma is generated in the vacuum chamber which interacts with the contaminants to create neutrals. The fluid is then circulated through channels that are formed into a tray which is inserted into the bottom of the chamber. The neutrals then fall into the fluid on the tray, while magnetic shields prevent the cleaning plasma itself from doing so. In another embodiment, the vacuum vessel is an open-ended, hollow, cylindrical centrifuge which is tilted from the vertical. The fluid is then poured into the upper end of the cylinder as it is rotated to allow the fluid to coat the wall of the vessel. For this embodiment, the ions of high mass contaminants are driven from the plasma by centrifugal force and are caused to become trapped and suspended in the fluid at the vessel wall. The suspended contaminants are removed with the fluid at the bottom end of the cylinder.

13 Claims, 2 Drawing Sheets

PLASMA ASSISTED PROCESS VESSEL CLEANER

FIELD OF THE INVENTION

The present invention pertains generally to systems and methods for cleaning vacuum vessels. More particularly, the present invention pertains to systems and methods for cleaning vacuum vessels which do not compromise the vacuum that has been created in the vessel during a cleaning operation. The present invention is particularly, but not exclusively, useful for circulating a fluid through a vacuum vessel to trap contaminants in the vessel, and for then removing these trapped contaminants from the vacuum vessel along with the fluid.

BACKGROUND OF THE INVENTION

During any operation wherein a plasma is contained in a vacuum vessel, there is always a possibility that contaminants will collect in the vessel and degrade the vacuum properties, necessitating removal before operation of the vacuum vessel can be continued. For instance, in plasma arc systems or in plasma centrifuges where ions of a rotating plasma are separated in; chamber by centrifugal forces according to their masses, at least some of to plasma's ions will be driven into the chamber wall as the plasma transits the system. If so, they can collect on the chamber wall and thereby contaminate the chamber. Even for applications wherein ion collisions with the chamber wall are desired, they will still eventually contaminate the chamber and must be removed. In other systems wherein ions and neutrals of a plasma are used for deposition or etching of a substrate, such as may be required for the manufacture of semi-conductor wafers, the contamination problem also exists. For example, a device such as disclosed in U.S. application Ser. No. 08/690,149 for an invention entitled "Device and Method For Processing a Plasma to Alter the Surface of a Substrate," envisions the generation of contaminated particles which will collect on the walls of the vacuum chamber. In these, and in many other examples where vacuum chambers and process vessels are used to contain plasmas for a variety of purposes, the contaminants which are generated must somehow be removed from the vessel chamber in order to clean the vessel.

Heretofore, the removal of contaminants from a vacuum chamber has typically been a lengthy and involved process. Specifically, in order to clean a vacuum vessel chamber, it has been necessary to completely shut down the operation of the vacuum vessel. This has involved completely ceasing the operation, removing the plasma from the chamber, and compromising the vacuum in the vessel. Once all of this has been done, the vessel walls can then be either chemically or mechanically cleaned. Then, after the vessel walls have been properly cleaned, the vacuum in the vessel must be reestablished before a plasma can again be generated in the vacuum vessel. Not surprisingly, all of this can be expensive and time consuming.

In light of the above, it is an object of the present invention to provide a system and method for removing plasma contaminants from a vacuum vessel which can be accomplished without compromising the vacuum in the vacuum vessel. Another object of the present invention is to provide a system and method for removing deposited contaminants from the wall of a plasma centrifuge or plasma arc system which can be accomplished during the continued operation of the system. Still another object of the present invention is to provide a system and method for removing plasma contaminants from a vacuum vessel which is conceptually easy to operate, relatively simple to manufacture and comparatively cost effective.

SUMMARY OF THE PREFERRED EMBODIMENTS

The systems and methods for cleaning the chamber of a plasma process vacuum vessel in accordance with the present invention provide for the introduction and circulation of a flowable material (e.g. fluid) through the chamber. The objective is that the circulating fluid will collect and remove the contaminants from the chamber. Importantly, this is done without compromising the vacuum in the vessel and may, for some configurations of the vessel, be accomplished during the vessel's normal operation. To do this, the flowable material, which will generally be a fluid like substance such as a low vapor pressure oil, is circulated through the chamber of the vacuum vessel and positioned to trap the contaminants that are in the vessel chamber. The trapped contaminants then become suspended in the fluid (flowable material) and are removed from the chamber with the fluid.

As a practical matter, depending on the particular purpose for which a plasma is generated in the chamber, the chamber of the vacuum vessel can be either of two types. One type chamber is used for etching and deposition operations (e.g. semi-conductor manufacture) wherein particles in the plasma are used to alter the surface of a substrate. Another type chamber is one which can be used for the plasma separation of waste material. In both cases, unwanted contaminants will collect over time in the chamber and must be removed for subsequent operation of the vacuum vessel. The present invention applies to both types of vacuum vessels.

For the type vacuum vessel wherein a plasma is generated in the vessel to alter the surface of a substrate, a plasma assisted system for cleaning the vacuum vessel in accordance with the present invention includes in combination a plasma generator, a transfer tray, and a recycling pump. Specifically, the plasma generator is operated to neutralize contaminates that have collected on the walls of the vacuum vessel during a plasma process. The transfer tray is then used to trap these neutralized contaminates from the vessel and the recycling pump is used to circulate fluid on the transfer tray for removal of the released contaminants from the vessel. A mechanical or chemical cleaning of the vessel is thereby obviated.

In detail, the plasma generator which generates plasmas in the chamber during normal operation, is now provided to create a cleaning plasma in the vacuum vessel. For the present invention, this cleaning plasma can be generated using a gas such as oxygen, argon or hydrogen. In any event, the cleaning plasma is created and it interacts with contaminants on the vessel's walls to release the contaminants. The contaminants are then released from the wall to migrate through the vessel.

In order to clean the vacuum vessel of deposited contaminants, the transfer tray is inserted into the vessel and positioned therein so that the released contaminants will come into contact with the tray as they migrate in the vessel. More specifically, the released contaminants come into contact with a fluid that is carried on the transfer tray. For this purpose, the transfer tray is formed with a plurality of substantially parallel, open, interconnected channels. As intended for the present invention, the fluid which is circulated through the channels of the transfer tray is preferably a low vapor pressure oil, such as Octoil. While the fluid is thus exposed in the channels, inside the vessel, the released contaminants come into contact with the fluid and are collected by the fluid in the tray. In order to continuously introduce fresh fluid into the vessel for the collection of contaminants, and thereby avoid reaching an equilibrium condition wherein no additional contaminants can be collected by the fluid, the recycling pump is provided to circulate the oil through the channels of the transfer tray.

An important aspect of the above described embodiment of the present invention relies on the fact that the ridges which separate and define the channels on the transfer tray are alternatively established as north and south magnetic poles. With this arrangement, magnetic fields are created on the transfer tray which bridge over the fluid that is in each of the channels. The result of this is that, while the neutralized contaminants can freely pass through the magnetic fields for contact with the fluid, the charged ionized particles of the cleaning plasma cannot. Consequently, only neutralized contaminants can be collected and removed from the vessel by the fluid. Thus, a continuous cleaning operation is established wherein a cleaning plasma is created and remains confined inside the vessel that is being cleaned. While inside the vessel, the cleaning plasma releases contaminants that are deposited on the vessel walls. These neutralized contaminants then come into contact with the fluid on the transfer tray and are suspended by the fluid. The recycling pump then recycles the fluid to remove the contaminants from the vessel and to expose fresh fluid in the vessel for collecting any contaminants that still remain in the vessel.

In another aspect of the present invention, for the type of plasma process wherein a centrifuge is created for the purpose of separating particles in a rotating plasma according to their respective masses, the operational vacuum vessel is generally formed as an open-ended cylinder which defines a longitudinal axis. For the present invention, this longitudinal axis of the cylinder is tilted from a vertical orientation through an angle, α, which is preferably in a range from approximately ten degrees to approximately fifty degrees (10°–50°). A flowable material (fluid) is then introduced into the vacuum vessel through the upper end of the cylinder. As it is introduced, the fluid comes into contact with the cylinder's inner wall. Further, as the fluid is being introduced, the open-ended cylinder is also being rotated. Consequently, the introduced fluid is rotated with the cylinder to coat the cylinder's inner wall with the fluid as it flows through the cylinder in a direction from the upper end of the cylinder to the lower end of the cylinder. As the rotating plasma thus transits through the cylinder, the plasma particles which are driven into the inner wall of the cylinder by centrifugal forces will become trapped and suspended in the fluid on the cylinder wall. Thereafter, the particles will remain suspended in the fluid and can be removed from the cylinder along with the fluid as it circulates through the cylinder.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
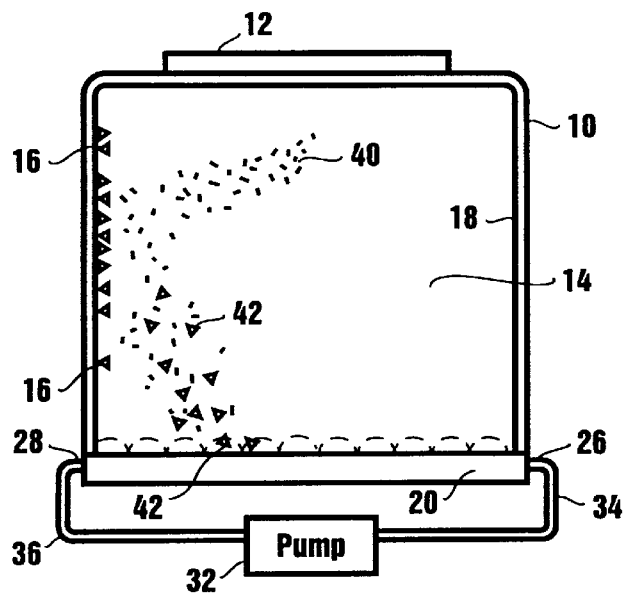
FIG. 1 is a schematic drawing, in cross section, of a plasma process vacuum vessel according to one embodiment of the present invention.

Referring initially to FIG. 1, it will be seen that the system and methods of the present invention contemplate the use of a plasma process vacuum vessel, such as the vessel shown and designated 10. Specifically, in a manner well known in the pertinent art, an antenna 12, which is externally located on the vessel 10 can be activated to generate a plasma inside the chamber 14 that is formed by the vessel 10. In a normal operation, a plasma would be generated inside the chamber 14 so that ions, or neutrals, or both could be used to alter, by etching or deposition, the surface of a substrate (not shown). As indicated above, however, an adverse side-effect of such operations is the fact that contaminants 16 will collect onto the inner wall 18 in the chamber 14 of the vacuum vessel 10. These contaminants 16 then need to be removed from the chamber 14 in order to continue and maintain the effective operation of the vacuum vessel 10.

Figure 2:
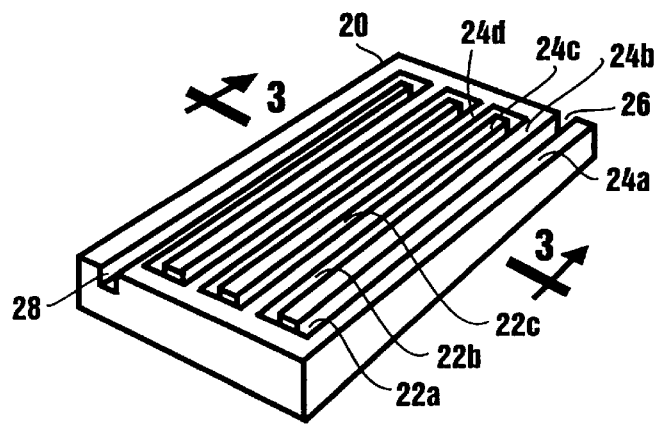
FIG. 2 is a perspective view of a transfer tray which is useable with the embodiment of the present invention shown in FIG. 1.

In FIG. 2, a tray 20 for use in the system of the present invention is shown to include a plurality of interconnected channels 22, of which the channels 22a–c are representative. Further, FIG. 2 shows that the channels 22 are separated by substantially elongated parallel ridges 24, of which the ridges 24a–d are representative. Accordingly, a series of parallel channels 22 are formed into the tray 20 which combine to form a fluid passageway that begins at an inlet 26 and continues across the tray 20 to an outlet 28. Stated differently, the channel 22a continues into channel 22b, which continues into channel 22c, and so on between the inlet 26 and the outlet 28.

Figure 3:
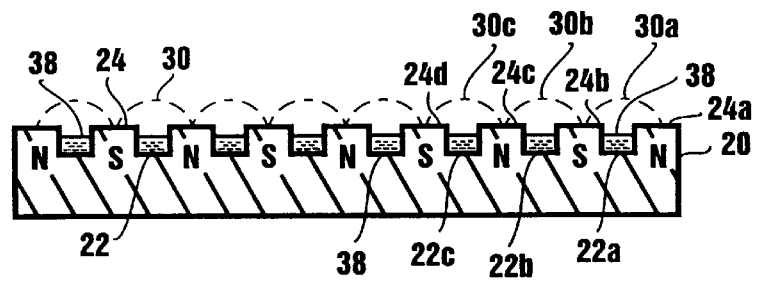
FIG. 3 is a cross sectional view of the transfer tray as seen along the line 3—3 in FIG. 2.

As best appreciated with reference to FIG. 3, the ridges 24 which separate the channels 22 are established as alternating magnetic poles. For example, as shown in FIG. 3, the ridge 24a is established as a north (N) pole, the ridge 24b is established as a south (S) pole, and the ridge 24c is established as a north (N) pole. The ridges 24 thus continue to alternate between N and S poles across the tray, as shown. A result of this polarity is that magnet fields are generated which cross over respective channels 22. More specifically, as represented by the magnetic field lines 30, magnetic field line 30a crosses over channel 22a between ridges 24a and 24b, a magnetic field line 30b crosses over channel 22b between ridges 24b and 24c and so on as before. In the contemplation of the present invention, the magnetic field lines 30 can be generated by permanent magnets in the ridges 24 or by any other type magnet well known in the pertinent art.

By returning to FIG. 1 it will be seen that a pump 32, or a device similar to a pump 32 well known in the art, is connected in fluid communication with the tray 20.

Specifically, a fluid communication line 34 interconnects the pump 32 with the inlet 26 of tray 20, and a fluid communication line 36 interconnects the pump 32 with the outlet 28 of tray 20. Preferably, a low vapor pressure oil, such as Octoil, is used as a flowable material 38 (e.g. a fluid) which can be circulated by the pump 32 through the channels 22 and between the ridges 24 from inlet 26 to outlet 28.

In the operation of the system and methods of the present invention for the removal of contaminants 16 from a process vacuum vessel 10 (FIGS. 1–3), the partial vacuum that has been created inside the chamber 14 of the vessel 10 for its normal operation need not be compromised. The plasma which was being generated in the chamber 14, however, should be removed and the tray 20 inserted into the chamber 14 in a manner that is well known in the art, before the cleaning operation begins. The fluid 38 is then circulated through the channels 22 by the action of the pump 32. Also, instead of the plasma which is normally contained in the chamber 14 during an etching or deposition operation, a cleaning plasma 40 that is made with a gas such as Argon (Ar), Oxygen ($O_2$), or Hydrogen ($H_2$) is generated in the chamber 14. As indicated above, contaminants 16 in the chamber 14 will generally be negatively charged particles which will deposit on the inner wall 18 of the chamber 14 and be neutralized. Unlike the cleaning plasma 40, however, which comprises charged particles that are affected by the magnetic field lines 30, the neutrals 42 will not be affected by the magnetic field lines 30.

More specifically, any movement of the cleaning plasma 40 toward the fluid 38 in tray 20 will be inhibited by the magnetic field lines 30. Not so with the neutrals 42 which will be generally unaffected by the magnetic field lines 30. Accordingly, the neutrals (which are, in effect, the contaminants 16) can become trapped and suspended in the fluid 38 and removed from the chamber 14 as the fluid 38 is circulated through the channels 22.

Figure 4:
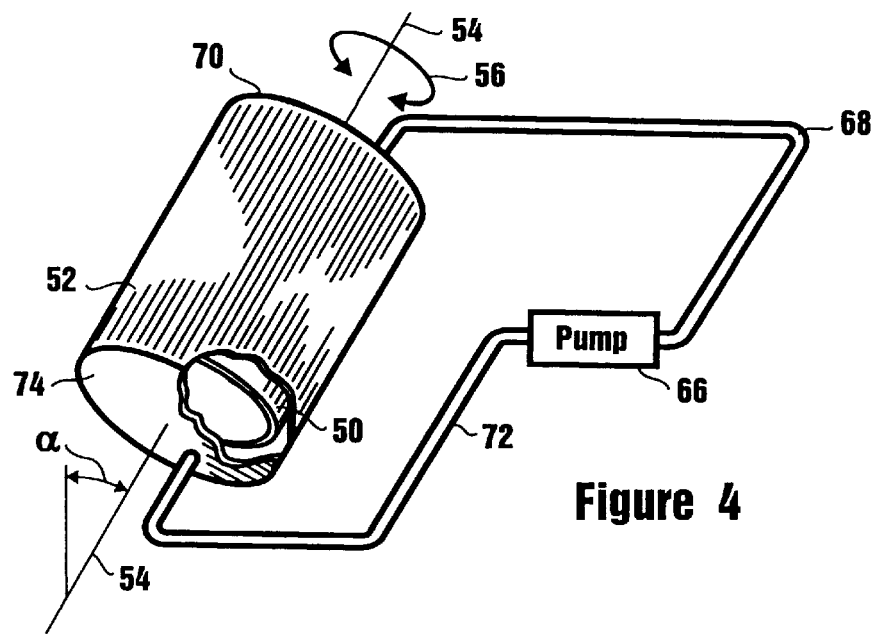
FIG. 4 is a schematic drawing, in perspective, of an alternate embodiment of a plasma vacuum vessel for use with the present invention, with portions of the drawing broken away for clarity.

Referring now to FIG. 4, an alternate preferred embodiment for a process vacuum vessel which can be used with the system and methods of the present invention is shown and designated 50. Specifically, for this embodiment of the present invention, the vacuum vessel 50 is cylindrical in its configuration and it is preferably mounted inside a cylindrical casing 52. As intended for this embodiment of the vessel 50, the cylindrical vessel 50 generally defines a longitudinal axis 54 and the vessel 50 is mounted inside the casing 52 for rotation, as indicated by the arrow 56, about the axis 54. The actual mechanism for rotating the cylindrical vessel 50 inside the casing 52 is a matter of design choice and can be accomplished in any of several different ways. For example, the rotation of vessel 50 in casing 52 can be accomplished by interactive rollers (not shown) which are positioned between the vessel 50 and the casing 52 and driven by a motor (also not shown).

Figure 5:
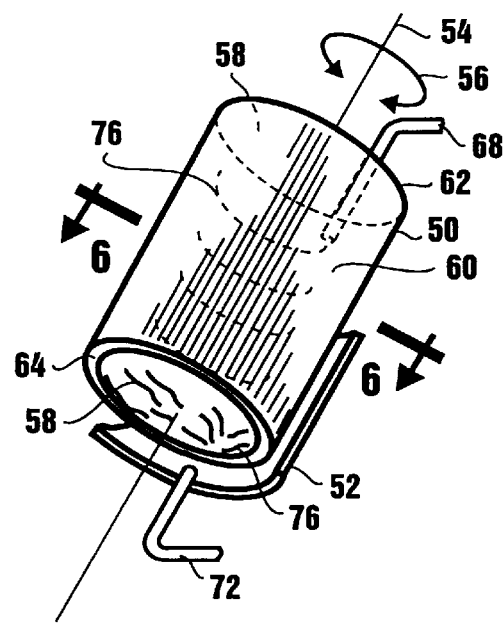
FIG. 5 is a schematic drawing of the embodiment of the plasma vacuum vessel as shown in FIG. 4 with additional portions broken away for exposure of additional features of the present invention.
Figure 6:
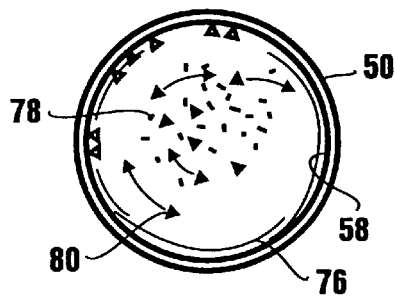
FIG. 6 is a cross sectional view of the vacuum vessel as seen along the line 6—6 in FIG. 5.

Perhaps a better appreciation of structure for the vessel 50 can be obtained from FIG. 5 wherein it will be seen that the vessel 50 is essentially and open-ended cylinder. Specifically, the inner wall 58 of the vessel 50 defines a chamber 60 which extends between an open end 62 and an open end 64 substantially as shown. Referring now back to FIG. 4, it will be seen that the system for this embodiment of the present invention will include a pump 66 which is connected in fluid communication with the inside of casing 52 via a conduit or fluid communication line 68 which is connected to the upper end 70 of the casing 52. Also, pump 66 is connected in fluid communication with the inside of casing 52 via a conduit or line 72 which is connected to the lower end 74 of the casing 52. While it is to be appreciated that the fluid 76 which is to be used with this embodiment of the vessel 50 is, preferably, a low vapor pressure oil (e.g. Octoil), it is also to be understood that flowable materials such as sand, glass beads, or activated charcoal may also work for the purposes of the present invention. In any case, as can be appreciated by cross referencing FIG. 4 and FIG. 5, the pump 66 will circulate the fluid 76 (flowable material) through the vessel 50 by introducing the fluid 76 into the upper end 70 of the casing 52 through the line 68. As shown in FIG. 5, as the fluid 76 is introduced into the casing 52 it is allowed to contact the inner wall 58 of the vessel 50. Recall, the vessel 50 is rotatable. Further, as shown in FIG. 4, the axis 54 of the vessel 50 is tilted from the vertical by an angle, $\alpha$. Consequently, as the vessel 50 is rotated (arrow 56), the fluid 76 will be made to coat the inner wall 58 as the fluid 76 transits the chamber 60 from end 62 toward end 64. Preferably, in order to ensure a substantially uniform fluid 76 coating on the inner wall 58, the angle $\alpha$ is selected to be in a range from approximately ten degrees to approximately fifty degrees (10°–50°).

In the operation of the vessel 50, a rotating plasma is introduced into the chamber 60 of vessel 50 and is caused to continue this rotation as it transits the chamber 60 from end 62 toward end 64. Preferably, this is accomplished by orienting a magnetic field $B_z$ along the axis 54 and by creating an electric field $E_r$ which is radially oriented on the axis 54. These crossed magnetic ($B_z$) and electric ($E_r$) fields will then establish the motive forces for moving charged plasma particles in the chamber 60 along helical paths that are generally centered on the axis 54. As is well known, such a condition creates a plasma centrifuge wherein charged particles in the plasma are subjected to centrifugal forces that tend to separate the particles according to their masses.

As intended for the present invention, most of the relatively low mass particles 78 of the rotating plasma will preferably transit through the chamber 60 without contacting the inner wall 50. On the other hand, the high mass particles 80, which are driven by centrifugal forces to the inner wall 58, will be trapped by the fluid 76 that coats the inner wall 58 and be suspended therein. Subsequently, as indicated above, the particles 80 will be removed from the chamber 60 and collected with the fluid 78. The particles 80 are thereby separated and segregated from the lower mass particles 78. This can be a very advantageous result for operations wherein the high mass particles 80 may be radionuclides.

While the particular Plasma Assisted Process Vessel Cleaner as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A cleaning system for the removal of contaminants during a plasma processing operation which comprises:

a vacuum vessel having a wall defining a chamber, said chamber holding a plasma under a vacuum;

a fluid flowing over at least a portion of said wall in said vacuum during said plasma processing operation, said fluid being positioned in said chamber for receiving contaminants from the plasma generated in said vacuum during said plasma processing operation, said contaminants being taken into suspension in said fluid; and means for removing said fluid with suspended contaminants from said vessel in said vacuum during said plasma processing operation for subsequent disposal thereof.

2. A system as recited in claim 1 wherein the contaminants are ions and the system further comprises:

means for generating a cleaning plasma in said chamber to release neutralized contaminants; and magnetic means for shielding said fluid from the cleaning plasma in said vessel to separate the neutralized contaminants from the cleaning plasma and allow the neutralized contaminants to contact and become suspended in said fluid for disposal of the neutralized contaminants with said fluid.

3. A system as recited in claim 2 wherein said means for removing said fluid comprises:

a tray formed with a plurality of interconnected channels, said tray being insertable into said chamber to establish said portion of said wall; and a fluid pump connected in fluid communication with said channels for circulating the fluid through said channels in said chamber.

4. A system as recited in claim 3 wherein said interconnected channels are separated by substantially elongated parallel ridges therebetween, and wherein said magnetic means is a series of alternating magnetic north poles and magnetic south poles with each said ridge being one said magnetic pole.

5. A system as recited in claim 1 wherein said vacuum vessel is a hollow cylinder defining a longitudinal axis and having an open first end and an open second end, and wherein said axis of said cylinder is tilted from a vertical orientation through an angle, $\alpha$, with said first end above said second end, and wherein said system further comprises:

means for introducing the fluid into said first end of said vacuum vessel for movement of said fluid along said wall between said first end and said second end; and means for rotating said cylinder to coat said wall with said fluid.

6. A system as recited in claim 5 wherein said angle $\alpha$ is in a range from approximately ten degrees to approximately fifty degrees (10°–50°).

7. A system as recited in claim 1 wherein said fluid is a low vapor pressure oil.

8. A system for cleaning contaminants from a chamber of a vacuum vessel during a plasma processing operation while the vessel maintains a vacuum which comprises:

a fluid source connected in fluid communication with said chamber; and means for circulating a fluid from said fluid source into said chamber, through said chamber, and out of said chamber while said chamber maintains said vacuum, in order to expose said fluid to the contaminants in the chamber, to receive the contaminants in said chamber into suspension in said fluid, and to remove the contaminants suspended in said fluid from said chamber with said fluid.

9. A system as recited in claim 8 wherein the contaminants are ions and said system further comprises:

means for generating a cleaning plasma in said chamber to release the contaminants; and magnetic means for shielding said fluid in said chamber from the cleaning plasma in said chamber to separate the neutralized contaminants from the cleaning plasma and allow the neutralized contaminants to contact and become suspended in said fluid for disposal of the neutralized contaminants with said fluid from said chamber.

10. A system as recited in claim 9 wherein said means for circulating said fluid comprises:

a tray formed with a plurality of interconnected channels, said tray being insertable into said chamber; and a fluid pump connected in fluid communication with said channels for circulating the fluid therethrough.

11. A system as recited in claim 10 wherein said interconnected channels are separated by substantially elongated parallel ridges therebetween, and wherein said magnetic means is a series of alternating magnetic north poles and magnetic south poles with each said ridge being one of said magnetic poles.

12. A system as recited in claim 8 wherein said vacuum vessel is a hollow cylinder defining a longitudinal axis and having an open first end and an open second end with a wall therebetween, and wherein said longitudinal axis of said cylinder is tilted from a vertical orientation through an angle, $\alpha$, with said first end above said second end, and wherein said system further comprises:

means for introducing the fluid into said first end of said vacuum vessel for movement of said fluid along said wall between said first end and said second end; and means for rotating said cylinder to coat said wall with said fluid.

13. A system as recited in claim 12 wherein said angle $\alpha$ is in a range from approximately ten degrees to approximately fifty degrees (10°–50°).

* * * * *